United States Patent
Shiotsuka et al.

(10) Patent No.: US 6,706,960 B2
(45) Date of Patent: Mar. 16, 2004

(54) COATING MATERIAL AND PHOTOVOLTAIC ELEMENT

(75) Inventors: Hidenori Shiotsuka, Kanagawa (JP); Akiharu Takabayashi, Nara (JP); Ichiro Kataoka, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/143,012

(22) Filed: May 13, 2002

(65) Prior Publication Data
US 2002/0185170 A1 Dec. 12, 2002

(30) Foreign Application Priority Data

May 17, 2001 (JP) .......................... 2001-147408
May 9, 2002 (JP) .......................... 2002-133446

(51) Int. Cl.$^7$ .......................... H01L 31/048
(52) U.S. Cl. .................. 136/251; 136/256; 136/246; 136/259; 257/433; 257/436; 428/424.2; 428/447; 428/500; 525/55; 525/59; 525/100
(58) Field of Search .................. 136/251, 256, 136/246, 259; 257/433, 436; 428/424.2, 447, 500; 525/55, 59, 100

(56) References Cited

U.S. PATENT DOCUMENTS

| | | | |
|---|---|---|---|
| 5,389,159 A | 2/1995 | Kataoka et al. | 136/251 |
| 5,421,909 A | 6/1995 | Ishikawa et al. | 136/256 |
| 5,656,098 A | 8/1997 | Ishikawa et al. | 136/256 |
| 5,804,616 A * | 9/1998 | Mowrer et al. | 523/421 |
| 5,807,440 A | 9/1998 | Kubota et al. | 136/256 |
| 6,107,563 A | 8/2000 | Nakanishi et al. | 136/256 |
| 6,121,542 A | 9/2000 | Shiotsuka et al. | 136/256 |
| 6,323,416 B1 | 11/2001 | Komori et al. | 136/259 |
| 6,414,236 B1 * | 7/2002 | Kataoka et al. | 136/251 |
| 2001/0009160 A1 * | 7/2001 | Otani et al. | 136/251 |
| 2002/0038664 A1 * | 4/2002 | Zenko et al. | 136/251 |
| 2002/0110682 A1 * | 8/2002 | Brogan | 428/325 |

FOREIGN PATENT DOCUMENTS

| | | |
|---|---|---|
| EP | 0 107 357 A2 | 5/1984 |
| JP | 57-31312 B2 | 7/1982 |
| JP | 59-82778 A | 5/1984 |
| JP | 60-34080 A | 2/1985 |
| JP | 2-1182 A | 1/1990 |
| JP | 5-54277 | 8/1993 |
| JP | 9-8341 A | 1/1997 |
| JP | 10-326903 | 12/1998 |
| JP | 11-135817 A | 5/1999 |

* cited by examiner

*Primary Examiner*—Alan Diamond
(74) *Attorney, Agent, or Firm*—Fitzpatrick, Cella, Harper & Scinto

(57) ABSTRACT

The present invention provides a coating material that resin-coats a light-receiving plane side of a photovoltaic element, and which can increase a conversion efficiency by effectively using light incident on the photovoltaic element and is excellent in weatherability, because the coating material comprises a resin that is a polymer blend containing at least a first polymeric material, and a second polymeric material made by bonding a polymer component (A) and a polymer component (B), wherein the polymer component (A) includes a functional group with comparatively high compatibility with the first polymeric material, and a polymer component (B) includes a functional group with compatibility with the first polymeric material that is lower than the compatibility of the functional group of the polymer component (A), and wherein the polymer component (B) forms an aggregate.

17 Claims, 1 Drawing Sheet

COATING MATERIAL AND PHOTOVOLTAIC ELEMENT

BACKGROUND OF THE INVENTION

1. Field of the Invention

The present invention relates to a coating material and a photovoltaic element, and in particular, to a photovoltaic element whose light-incident side is resin-coated.

2. Related Background Art

There is a technique that can be used to form a photovoltaic element on a substrate having physical unevenness, which is called texture. It is one of the means for increasing conversion efficiency (electrical output) of the photovoltaic element.

For example, there are a method of unevenly forming an ITO film or an $SnO_2$ film on flat glass and making its surface uneven (Japanese Patent Publication No. 57-31312), a method of forming a rough surface by sand blasting or sputtering a substrate (Japanese Patent Publication No. 58-176101), and a method wherein a photovoltaic element substrate on which a surface of a metal thin film formed by plasma CVD etc. has texture (Japanese Patent Publication No. 01-31946). All of the above methods are used to increase the total quantity of light passing through a photoelectric conversion layer for generating an electromotive force, as a so-called "optical confinement effect", by making incident light irregularly reflect at the inside of a photovoltaic element due to physical unevenness. However, the textured structure, which is physically uneven, results in a problem by causing a reduction in productivity and the variation of characteristics between the elements due to the defects of the photoelectric conversion layer, particularly in a convex portion, or the variation of the film thickness of the photoelectric conversion layer. In addition, the junction breaking between a photoelectric conversion layer and an electrode, leakage of a current, ohmic loss, etc., generate and may therefore cause a decrease in a conversion efficiency. Furthermore, such techniques have a problem in that that plant and equipment investments are immense.

In addition, a method of making incident light efficiently reach a photoelectric conversion layer, like the above-described techniques, by providing an optical diffusion resin layer containing particles in a light-receiving plane side of a photovoltaic element has been investigated.

Specifically, disclosed methods include a method of providing a resin composite, which is formed by adding a filler whose refraction index differs from a resin by 0.01 or more to a resin mixture comprising one or more kinds selected from an epoxy resin, an acrylic resin, a silicone resin, EVA, PVA and PVB, on a surface of a photovoltaic element (Japanese Patent Publication No. 5-54277 (Japanese Patent Application Laid-Open No. 60-34080)), a method of providing a transparent resin on a photovoltaic element, wherein the resin is made by dispersing a non-compatible resin in a transparent resin component (Japanese Patent Application Laid-Open No. 09-8341), a method of applying a mixed solution including a binder resin and one or more kinds of fine particles including fine particles composed of a material that is at least the same as the above-described binder resin, on a photovoltaic element, and forming unevenness on a surface of the photovoltaic element (Japanese Patent Application Laid-Open No. 10-326903), and a method of forming a diffusion layer with a photosensitive polymer that has particles (Japanese Patent Application Laid-Open No. 11-135817).

While it can be expected from these techniques that conversion efficiency is improved by an optical confinement effect, plant and equipment investments are small in comparison with costs involved in changing the above-described substrate processing method and the film formation method. Also, it is possible to avoid a danger of severely worsening the electrical characteristics of a photovoltaic element such as junction breaking and a leakage current between the photoelectric conversion layer and an electrode.

However, since an optical diffusion layer is formed with the resin that is mixed with the particles or a filler, long-term use under harsh environmental conditions such as those encountered outdoors, causes peeling in a boundary between the resin and an insoluble resin or additives such as particles, and plenty of minute air layers generate in the optical diffusion layer. Consequently, since the light transmittance of the optical diffusion layer itself drops, the amount of light arriving at the photoelectric conversion layer decreases. Therefore, the conversion efficiency of the photovoltaic element decreases. Furthermore, moisture penetrates due to peeling and the electrical characteristics of the photovoltaic element are reduced. It is hard to say that a photovoltaic element, such as a solar battery, having the above-described structure is durable if it is used, in particular, in the outdoor environment.

SUMMARY OF THE INVENTION

An object of the present invention is to provide a photovoltaic element that has excellent conversion efficiency, while providing a stable optical diffusion layer that can maintain an optical confinement effect even in a prolonged outdoor exposure.

To achieve the above described object, the present invention provides a coating material that resin-coats a light-receiving plane side of a photovoltaic element, which coating material comprises a resin, the resin being a polymer blend containing at least a first polymeric material, and a second polymeric material made by bonding a polymer component (A) and a polymer component (B), wherein the polymer component includes a functional group with comparatively high compatibility with the above-described first polymeric material, and the polymer component (B) includes a functional group with compatibility with the first polymeric material that is lower than the compatibility of the functional group of the polymer component (A), and wherein the polymer component (B) forms an aggregate. In addition, the present invention provides a photovoltaic element in which at least a light-receiving plane side is resin-coated with a resin, the resin being a polymer blend containing at least a first polymeric material, and a second polymeric material made by bonding a polymer component (A) and a polymer component (B), wherein the polymer component (A) includes a functional group with comparatively high compatibility with the above-described first polymeric material, and the polymer component (B) includes a functional group with compatibility with the first polymeric material that is lower than the compatibility of the functional group of the polymer component (A), and wherein the polymer component (B) forms an aggregate.

In the above-described coating material and photovoltaic element of the present invention, it is preferable that the above-described resin is a polymer blend in which the above-described first polymeric material and the above-described second polymeric material form cross-linked structure.

In addition, it is preferable that the above-described second polymeric material contains a hydroxyl group, and it is more preferable that both the above-described polymer component (A) and the above-described polymer component (B) contain hydroxyl groups.

In addition, it is preferable that the above-described polymer component (B) is a polymer that contains a polysiloxane group.

Furthermore, it is preferable that a refraction index of the above-described polymer component (B) differs from that of another polymer component that constitutes the above-described polymer blend.

In addition, it is preferable that the first polymeric material and the polymer component (A) are polymers that comprise a monomer containing a vinyl group.

It is preferable that a component ratio of the above described polymer component (A) contained in the second polymeric material is 10 to 90 parts by weight.

It is preferable that a monomer constituting a polymer component (B) contains a siloxane group and a vinyl group, and a numerical ratio of the siloxane group to the vinyl group is 1 to 1000.

In addition, other characteristics and advantageous effects of the present invention will be described later in detail.

DETAILED DESCRIPTION OF THE PREFERRED EMBODIMENTS

Although embodiments of a preferable coating material and a preferable photovoltaic element according to the present invention will be described below in detail, the present invention is not at all limited to these embodiments.

Figure 1A:
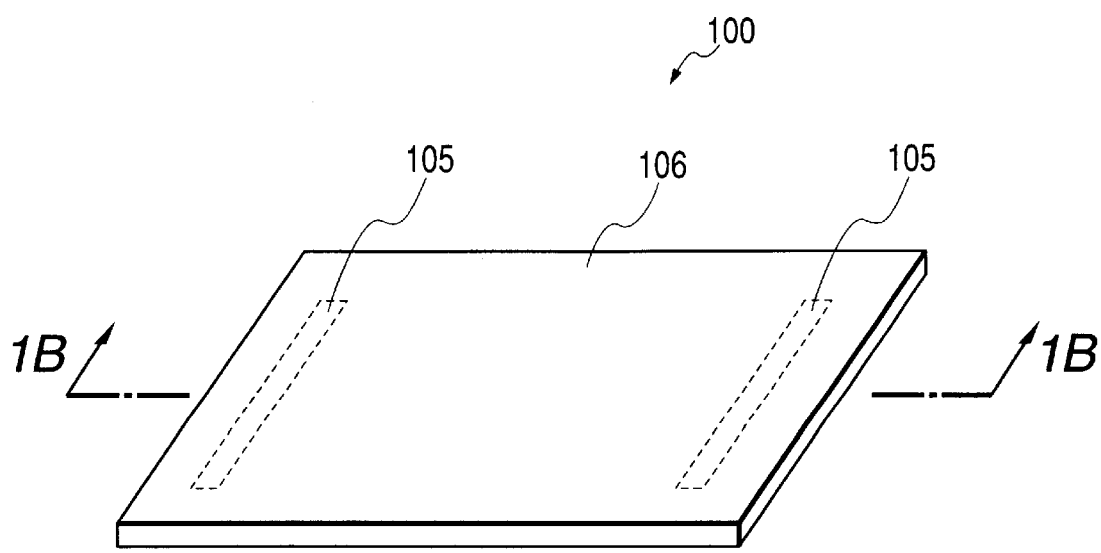
FIG. 1A is a perspective view of a photovoltaic element according to an embodiment of the present invention.
Figure 1B:
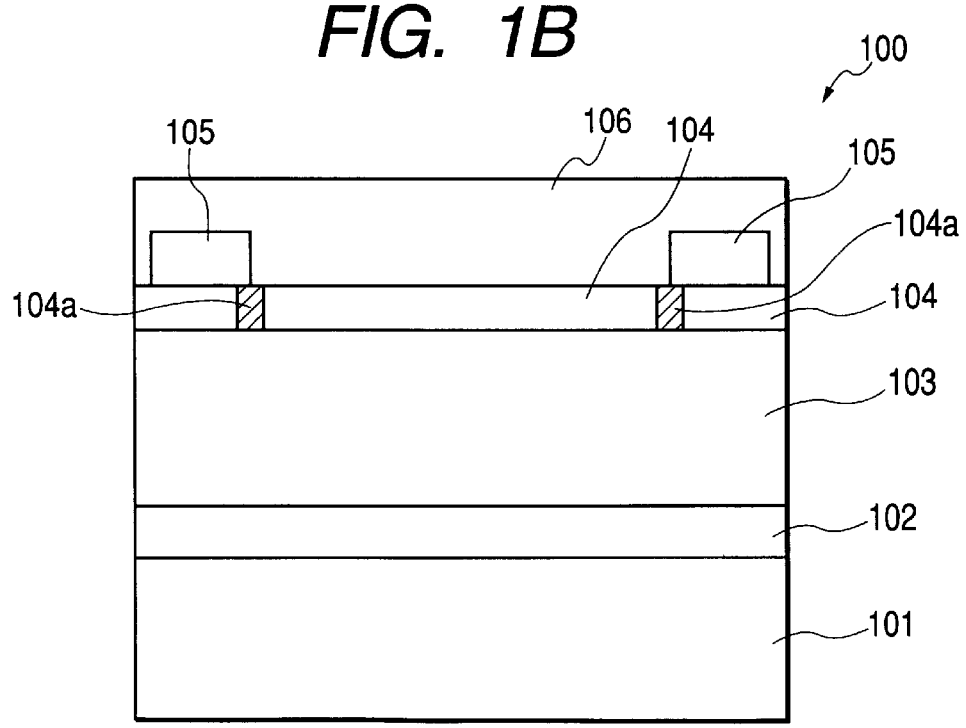
FIG. 1B is a sectional view taken along the line 1B—1B of FIG. 1A.

FIGS. 1A and 1B show an example of the photovoltaic element of the present invention. FIG. 1A is a perspective view of the photovoltaic element and FIG. 1B is a sectional view taken along the line 1B—1B of FIG. 1A. FIGS. 1A and 1B show a photovoltaic element 100, an electroconductive base member 101, a back side reflective layer 102, a semiconductor photo-active layer 103, a transparent electroconductive layer 104, a collecting electrode 105, and an optical diffusion layer 106 consisting of a coating material according to the present invention. Each reference character 104a denotes a section where the transparent electroconductive layer is removed.

Photovoltaic Element 100

A general photovoltaic element can be suitably used for the photovoltaic element 100 of the present invention. It is possible to produce the photovoltaic element of the present invention by coating at least a part of a light-receiving plane side of the photovoltaic element 100 with a resin described later.

Among them, since an amorphous silicon (a-Si) based-photovoltaic element is more advantageous than other crystal- and compound-based semiconductor photovoltaic elements in production cost and can be applied to various photovoltaic element forms because of mechanical flexibility and high workability, an a-Si photovoltaic element is preferable Electroconductive Base Member 101

While the electroconductive base member 101 functions as a base member of the photovoltaic element, it also plays the role of a lower electrode. As the material of the base member, there are silicon, tantalum, molybdenum, tungsten, stainless steel, aluminum, copper, titanium, a carbon sheet, a lead-plated steel sheet, a resin film and ceramic glass, on which an electroconductive layer is formed, etc.

Back Side Reflective Layer 102

It is also good to form a metal layer, a metallic oxide layer, or a stacked layer composed of a plurality of metal layers and metallic oxide layers on the above-described conductive base member 101 as a back side reflection layer 102. For example, Ti, Cr, Mo, W, Al, Ag, Ni, Cu, etc. are used for the metal layer, and ZnO, $TiO_2$, $SnO_2$, ITO, etc. are used for the metallic oxide layer. As a formation method of the above-described metal layer and metallic oxide layer, a resistance heating vacuum deposition method, an electron beam evaporation method, a sputtering method, etc. may be used.

Semiconductor Photo-Active Layer 103

It is required to have a semiconductor junction such as a pn junction, a pin junction, or a Schottky junction, as the semiconductor photo-active layer 103. In addition, not only a single cell but also a tandem cell and a triple cell where a plurality of pin junctions or pn junctions are stacked can be suitably used. Specific examples of the above-described tandem cell structure are a stacked structure of a top pin cell and a bottom pin cell each having a-Si i-type layer, and a stacked structure of a top pin cell having an a-Si i-type layer and a bottom pin cell having an a-SiGe i-type layer. In addition, it is also preferable that a top cell is made to have the pin structure having an a-Si i-type layer and a bottom cell is made to have the pn structure composed of a polycrystalline thin film. Specific examples of the above-described triple cell structure are a stacked structure of a top cell and a middle cell each having a pin structure having an a-Si i-type layer, and a bottom cell having a pin structure having an a-SiGe i-type layer, and a stacked structure of a top cell having pin structure having an a-Si i-type layer, a middle cell having pin structure having an a-SiGe i-type layer, and a bottom cell having pin structure having an a-SiGe i-type layer.

As formation methods of the above-described semiconductor photo-active layer 103, there are a plasma CVD method using silane gas, etc. as a raw material, a vacuum deposition method, a sputtering method, a thermal decomposition method, etc.

Transparent Electroconductive Layer 104

The transparent electroconductive layer 104 plays the role of an upper electrode of the photovoltaic element. As a material of the transparent electroconductive layer to be used, there is, for example, a crystalline semiconductor layer formed by performing the high concentration impurity doping of $In_2O_3$, $SnO_2$, $In_2O_2$-$SnO_2$ (ITO), ZnO and $TiO_2$, $Cd_2SnO_2$, or the like. As formation methods, there are resistance heating evaporation, a sputtering method, a spray method, CVD, an impurity diffusion method, etc.

Collecting Electrode 105

In order to collect current efficiently, a collecting electrode (grid electrode) 105 with grid geometry may be provided on the transparent electroconductive layer 104. As specific material for the collecting electrode 105, for example, Ti, Cr, Mo, W, Al, Ag, Ni, Cu, Sn, alloys thereof, or electroconductive paste including silver paste, etc. can be used.

As formation methods of the collecting electrode 105, a sputtering method, a resistance heating method, a CVD method using a mask pattern a method of performing patterning by removing an unnecessary portion by etching after depositing a metal film on the whole surface, a method of directly forming a grid electrode pattern by optical CVD, a method of performing plating after forming a negatively patterned mask of a grid electrode pattern, a method of printing a conductive paste, a method of sticking a metal wire coated with an electroconductive paste, and the like can be used. A binder polymer in which finely powdered silver, gold, copper, nickel, carbon, or the like is usually dispersed is used as the electroconductive paste. As the binder polymers, for example, resins such as polyester, epoxy, acrylic, alkyd, polyvinyl acetate, rubber, urethane, and phenol can be used.

Optical Diffusion Layer 106

Next, the optical diffusion layer 106 used in the present invention will be described below in detail.

The optical diffusion layer 106 is formed on the transparent electroconductive layer 104 in a light-receiving plane side of a photovoltaic element.

The optical diffusion layer 106 contains at least a first polymeric material and a second polymeric material made by bonding a polymer component (A) and a polymer component (B), wherein the polymer component (A) includes a functional group with a comparatively high compatibility with the first polymeric material. The polymer component (B) includes a functional group with a compatibility with the first polymeric material that is lower than the functional group of the polymer component (A). The polymer component (B) is composed of a polymer blend forming an aggregate.

The optical diffusion layer 106 comprising such a polymer blend is microscopically phase-separated into the first polymeric material, a portion where a polymer component with high compatibility with the first polymeric material is dispersed and a portion with low compatibility with the first polymeric material, and in such portions, refraction indices mutually differ. In the optical diffusion layer 106 such as this, since a refraction index changes with locations where light enters, the light that enters from one direction is scattered in other directions. The incident light repeats scattering and reaches the semiconductor photo-active layer 103. Thus, the optical diffusion layer 106 has an optical confinement effect. For example, since the light that enters on a non-power-generating region in a light-receiving plane side of the photovoltaic element usually continues on straight, it cannot contribute to power generation. However, by providing such an optical diffusion layer 106 in a non-power-generating region, the light that enters into the non-power-generating region is scattered, and can enter into the semiconductor photo-active layer 103. Hence, the total quantity of light incident on the semiconductor photo-active layer 103 is increased, and hence, conversion efficiency can be increased.

It is desirable that the first polymeric material naturally has high transparency and can cover the unevenness of the collecting electrode 105 and the like provided on the transparent electroconductive layer 104. As a specific material, ethylene-unsaturated fatty acid (ester) copolymer such as EVA and EMAA, an acrylic resin, a silicon-modified acrylic resin, acrylic silicone resin, etc. can be used. EVA and an acrylic resin that have flexibility are more preferable.

Next, the second polymeric material comprising the polymer component (A) and the polymer component (B) will be described.

The polymer component (A) is a polymer including at least one or more kinds of functional groups with high compatibility with the above-described first polymeric material. Bonding such a polymer component (A) with the polymer component (B) prevents the polymer component (B) from aggregating in high order, increases dispersibility over the first polymeric material, and makes it possible to uniformly disperse the polymer component (B) in the first polymeric material. In addition, it is expected that the bleaching of the polymer component (B) will be prevented and weatherability will be improved, because the polymer component (A) functions as an anchor to the first polymeric material.

Specifically, the polymer component (A) is a polymer obtained by polymerizing a monomer having a vinyl group, which is suitably selected from acrylic acid; acrylic acid ester such as methyl acrylate, ethyl acrylate, n-propyl acrylate, isopropyl acrylate, n-butyl acrylate, isobutyl acrylate, tert-butyl acrylate, n-hexyl acrylate, cyclohexyl acrylate, 2-ethylhexyl acrylate, and octyl acrylate; methacrylic acid; methacrylic acid ester such as methyl methacrylate, ethyl methacrylate, n-propyl methacrylate, isopropyl methacrylate, n-butyl acrylate, isobutyl methacrylate, tert-butyl methacrylate, n-hexyl methacrylate, 2-ethylhexyl methacrylate, and octyl methacrylate; fatty acid vinyl ester such as vinyl acetate; a hydroxyl group-containing vinyl monomer, etc.

The polymer component (B) is a polymer including at least one or more kinds of functional groups with compatibility lower than the functional group of the polymer component (A) that has high compatibility with the first polymeric material. The polymer component (B) must be lower in compatibility with the first polymeric material than the polymer component (A). The first polymeric material and the polymer component (B) cause phase separation due to the functional group with low compatibility, and partially form an aggregate having an island structure where refraction indexes partially differ. Thus, light incident onto a resin constituted like this is scattered in a portion where a refraction index differs, and can exert the above-described optical confinement effect as a result of repeated scattering. Although the polymer component (B) can be suitably selected from polymers that are lower in compatibility with the first polymeric material than the polymer component (A), it is more preferable for a photovoltaic element, and in particular, a solar battery application, to have high durability, including weatherability.

In addition, it is preferable that the first polymeric materials and the above-described polymer component (A) are polymers comprising a monomer containing a vinyl group. It is preferable that a component ratio of the polymer component (A) contained in the second polymeric material is 10 to 90 parts by weight.

Specifically, as the polymer component (B), a polysiloxane polymer that has the repeated structure of a siloxane bond, and a polymer including a fluorine-containing polymer can be used. These polymers have at least one or more polymeric functional groups that can be polymerized with the polymer component (A) at each molecular end. Such a polysiloxane polymer and a fluorine-containing polymer are polymerized from monomers including known siloxane, polysiloxane and their derivatives, and they are suitably selected and use.

In addition, it is also acceptable that a vinyl group is included in each end so that these polymers may be further polymerized with ease. It is preferable that a numerical ratio of a siloxane group and a vinyl group, which are contained in a monomer constituting the polymer component (B) and containing a siloxane group, is 1 to 1000. If the numerical ratio is more than 1000, phase separation with the first polymeric material occurs, deteriorating durability.

In order to have the optical confinement effect, which is one of the objects of the present invention, it is desirable that the number-average molecular weight of the polymer component (B) be in a range of 250 to 50000. It is more preferable that the number-average molecular weight be in a range of 500 to 20000. Since the number-average molecular weight of less than 250 becomes insufficient in light scattering, there is a possibility that a desired optical confinement effect may not be exerted. On the other hand, if the number-average molecular weight exceeds 50000, a phase separation with the first polymeric material will become significant, and there is a possibility that durability may decrease.

As for the second polymeric material, it is desirable to have a mixing rate of 0.1 parts by weight to 10 parts by weight based on the first polymeric material. If the mixing rate is less than 0.1 parts by weight, there is a possibility that no desired optical confinement effect may be exerted. If the rate is greater than 10 parts by weight, there is a possibility of reducing light transmittance, because light scattering becomes significant.

In addition, it is possible to further increase durability including weatherability by cross-linking the first polymeric material and second polymeric material to form a network structure. Especially when considering weatherability, cross-linking by the isocyanate is more preferable. If at least one of the first polymeric material and the second polymeric material, preferably the second polymeric material or more preferably both the polymer component (A) and polymer component (B), each have a hydroxyl group, cross-linking with an isocyanate compound becomes possible and weatherability can be further improved. It is desirable that a hydroxyl value of the second polymeric material is 5 to 90 mg/KOHmg. It is more preferable that the hydroxyl value is in a range of 20 to 75 mg/KOHmg. If the hydroxyl value is smaller than 5 mg/KOHmg, the effect of the improvement in weatherproofing by cross-linking is small. If the hydroxyl content is larger than 90 mg/KOHmg, cross-linking becomes excessive, the coating film becomes hard, and hence, the structure becomes weak due to outdoor temperature changes.

As isocyanate compounds that perform a cross-linking reaction, compounds formed by polymerizing monomers such as 2,4-tolylene diisocyanate, isophorondiisocyanate (IPDI), xylylendiisocyanate, 1,3-bis(isocyanatomethyl) cyclohexane ($H_6XDI$), and hexamethylene isocyanate (HDI) can be used. In applications where high transparence is required, $H_6XDI$ and HDI are preferable, which are non-yellowing types. Generally, the above-described isocyanate monomer is used as an isocyanate prepolymer, and is classified roughly into an adduct-based, a biuret-based, an isocyanurate-based, and an alphabet-based tetramethylene propanol (TMP). It is preferable to use an adduct-based or an isocyanurate-based TMP for applications where weatherability and thermal resistance are required. As for a mixing ratio of isocyanate groups in a resin, it is preferable that NCO/OH (mole ratio) is 0.5 to 5.0, and a ratio of 0.5 to 2.0 is more preferable.

In addition, since high weatherability is required for the optical diffusion layer 106 because it is provided on a surface of a photovoltaic element, it is desirable to suppress photodegradation by adding an ultraviolet absorber (UVA) to increase weatherability. Although it is possible to select a suitable UVA from the well-known UVAs, according to the results obtained by the present inventors, a more preferable UVA used for the photovoltaic element of the present invention is a compound that has a 1,3,5-triazine ring bonded with one or more ultraviolet absorption groups. Although the usage of additives can be suitably determined, it is preferable that the usage is about 0.01 to 5.0 parts by weight to 100 parts by weight of resin, and the usage of 0.1 to 0.5 parts by weight is more preferable.

As for the light transmittance of the optical diffusion layer 106 where the above-described UVA is blended within the above-described quantity of additives, in order to suppress photodegradation, it is desirable to shade almost all the light having a wavelength shorter than 370 nm. In addition, in order to transmit the light with a wavelength of 370 nm or more, which does not contribute to the photodegradation of a resin greatly, and to suppress the reduction of quantity of light that reaches a photovoltaic element, it is desirable that the light transmittance is 80% or more in a visible light wavelength region of 400 nm to 800 nm, and the light transmittance of 90% or more is more desirable.

It is known that a hindered amine-based light stabilizer as well as the above-described UVA can be used to provide weatherability. Although the hindered amine-based light stabilizer does not absorb ultraviolet rays like an ultraviolet absorber, it exerts a remarkable synergistic effect by using it together with the UVA. A general dosage is about 0.1 to 0.3% by weight to 100 parts by weight of a resin. Of course, although there are some that function as light stabilizers besides the hindered amine-based light stabilizer, they are not desirable for the present invention because of coloring in many cases.

In addition, in order to further increase the stability of the optical diffusion layer 106 under the elevated temperature, a thermal oxidation inhibitor may be added. A suitable dosage is 0.1 to 1.0 parts by weight to 100 parts by weight of a resin. As the chemical structure of well-known antioxidants, a monophenol-based, a bisphenol-based, a polymer type phenol-based, a sulfur-based, and a phosphoric acid-based antioxidants are suitably used.

In consideration of an operating environment as a photovoltaic element, especially a solar cell module like the UVA also in the above-described light stabilizer and the above-described thermal oxidation inhibitor, it is preferable to use a less volatile material. As for these additives, it is desirable to suitably select and use them together in consideration of the synergistic effect.

Intermediate Layer

An intermediate layer can be also arranged between the optical diffusion layer 106 and transparent electroconductive layer 104. It is possible to further increase the adhesion of the transparent electroconductive layer 104 and the optical diffusion layer 106 by arranging the intermediate layer. It is desirable to select a material for the intermediate layer from materials of the first polymeric material described in section of the optical diffusion layer 106 in consideration of the adhesion to the optical diffusion layer 106. Furthermore, it is more desirable that the material of the intermediate layer is the same as the first polymeric material used for the optical diffusion layer 106.

The photovoltaic element produced by the above-described technique is connected in parallel or in series according to a voltage or a current that is desired. In addition, it is also possible to obtain a desired voltage or a desired current by integrating a photovoltaic element on an insulated substrate.

In the photovoltaic element of the present invention having the structure described above, the following effects can be expect (1) Photovoltaic element excellent in initial characteristics Since the light incident into a non-power-generating region is scattered without lowering the transparency of the optical diffusion layer by providing the above-described optical diffusion layer in the light-receiving plane side of a photovoltaic element, it is possible to increase the total quantity incident onto a semiconductor photo-active layer, and hence, to increase conversion efficiency.

(2) Photovoltaic element excellent in weatherability

It is possible to make the optical diffusion layer of the present invention weatherable by forming a structure in which the first polymeric material and second polymeric material are cross-linked. Furthermore, it is possible to provide weatherability without deteriorating transparence, because cross-linking with an isocyanate compound becomes possible by introducing a hydroxyl group into the above-described second polymeric material.

(3) Photovoltaic element excellent in translucence

It becomes possible to obtain excellent initial translucence and to keep the translucence over a long period of time by using a polymer including polysiloxane groups as the polymer component (B).

Hereafter, on the basis of examples, the present invention will be described in detail.

Example 1

Production of a Photovoltaic Element

An amorphous silicon (a-Si) photovoltaic element was produced as follows.

On a cleaned stainless steel substrate, an Al layer (500 nm in film thickness) and a ZnO layer (500 nm in film thickness) were formed one by one as a back side reflection layer by sputtering. Subsequently, by a plasma CVD method, an n-type a-Si layer was formed from a mixed gas of $SiH_4$, $PH_3$, and $H_2$, an i-type a-Si layer from a mixed gas of $SiH_4$ and $H_2$, a p-type microcrystaline silicon ($\mu$c-Si) layer from a mixed gas of $SiH_4$, $BF_3$, and $H_2$ to form a tandem type a-Si semiconductor photo-active layer having the layer structure of a n-type layer with a film thickness of 15 nm, an i-type layer with a film thickness of 400 nm, a p-type layer with a film thickness of 10 nm, a n-type layer with a film thickness of 10 nm, an i-type layer with a film thickness of 80 nm, and a p-type layer with a film thickness of 10 nm. As a transparent electroconductive layer, an $In_2O_3$ thin film (70 nm in film thickness) was formed by performing evaporation deposition of In by the resistance heating method under an $O_2$ environment. Then, removal processing of defects of the photovoltaic element was performed. Thus, by dipping a photovoltaic element and an electrode board so that the electrode board may face the transparent electroconductive layer of the photovoltaic element in an aqueous solution of aluminum chloride adjusted so that an electric conductivity might become 50 to 70 mS, and applying a positive electric potential of 3.5 V to the electrode board for 2 seconds with grounding the photovoltaic element, a shunt portion of the transparent electroconductive layer was selectively decomposed. Owing to this processing, the shunt resistance of the photovoltaic element was improved to 50 k$\Omega\cdot cm^2$ to 200 k$\Omega\cdot cm^2$ after the processing from 1 k$\Omega\cdot cm^2$ to 10 k$\Omega\cdot cm^2$ before the processing.

Next, a grid electrode for current collection was provided. After arranging a copper wire with the diameter of 100 $\mu$m, which was coated with a conductive paste, they were hot-pressed to form a collecting electrode.

Formation of an Optical Diffusion Layer

The second polymeric material (1) (hydroxyl value: 60 mg/KOH, average molecular weight: 20,000), which was formed by bonding a polymer component, obtained from polymerization of monomers having a vinyl group, with a polysiloxane was mixed with a coating material comprising an acrylic resin. As a cross-linking material, HDI isocyanurate blocked with MEK oxime was added so that NCO/OH (mole ratio) might become 1.5. Furthermore, this was diluted with xylene and MBK so that a solid content might become 35 parts by weight. As for mixed quantity, a solid content was 0.45 parts by weight to 100 parts by weight of solid content of an acrylic resin. After sufficiently siring the above-described coating material, it was sprayed on the light-receiving plane side of the photovoltaic element and heated for 10 minutes at 180° C. to be cured, and the optical diffusion layer with average film thickness of 20 $\mu$m was provided.

After the photovoltaic elements according to the present invention was obtained, evaluation was performed for the following items. The evaluation results are shown in Table 1.

(1) Measurement of initial total light transmittance

A transparent white board (thickness: 0.9 mm) was used as a substrate, and the optical diffusion layer was formed by the same method as the above-described production method. Subsequently, total light transmittance in a wavelength range of 300 nm to 1000 nm was measured.

Evaluation criteria

When the total light transmittance of glass was set to 100:

AA: 101 or more

A: not smaller than 98, but smaller than 101

C: smaller than 98.

(2) Weatherability test

The photovoltaic elements were put into a test box, were subjected to a duty cycle test in which the irradiation of UV having a 300-nm to 400-nm wavelength region in the intensity of 100 mW/cm$^2$ by a metal halide lamp and dew condensation were repeatedly performed and were observed for a change in appearance after 10000 hours.

Evaluation criteria:

A: no problem in appearance

C: generation of chalking and whitening on surface of photovoltaic element (3) Temperature cycle test The photovoltaic elements were put into an environmental box, an environment in the box was kept in a condition (1) of 85° C. and 85%RH for 22 hours, and then, in a condition (2) of –40° C. for 1 hour, and the conditions (1) and (2) were repeated. In addition, the shift of (1) to (2) and (2) to (1) was 30 minutes each, twenty four hours were set as one cycle, and tests of 20 and 50 cycles were performed.

Evaluation criteria:

A: no problem in appearance

C: generation of chalking and whitening on surface of photovoltaic element

Example 2

Photovoltaic elements was produced and evaluated similarly to Example 1, except that a cross-linking material made of methylated melamine and a curing temperature of 120° C. were used. The evaluation results are shown in Table 1.

Example 3

The photovoltaic elements were produced and evaluated similarly to Example 1, except that instead of the second polymeric material (1) in Example 1, the second polymeric material (2) (hydroxyl value 30 mg/KOH) made by bonding a polymer component, which was polymerized from several kinds of monomers having a vinyl group, and a polymer component including fluorine (fluorine content: 45%, average molecular weight: 5,000) was used. The evaluation results are shown in Table 1.

Comparative Example 1

The photovoltaic elements were produced and evaluated similarly to Example 1, except that 10 parts by weight of a polysiloxane polymer (average molecular weight: 25,000) were mixed instead of the second polymeric material (1). The evaluation results are shown in Table 1.

Comparative Example 2

The photovoltaic elements were produced and evaluated similarly to the Example 1, except that 30 parts by weight of fine particles of silicon oxide (average particle size: 10 nm) were mixed instead of the second polymeric material (1). The evaluation results are shown in Table 1.

Comparative Example 3

The photovoltaic elements were produced and evaluated similarly to Example 1, except that 30 parts by weight of fine particles of titanium oxide (average particle size: 25 nm) were mixed instead of the second polymeric material (1). The evaluation results are shown in Table 1.

As apparent in Table 1, the photovoltaic elements of Examples 1 to 3, in which the optical diffusion layer provided on a transparent electroconductive layer of each photovoltaic element was composed of a polymer blend according to the present invention, showed good results also in the above-described evaluation test. Especially, in Example 1, it is expected that conversion efficiency will be increased by the optical confinement effect and that the element will also function with stability in actual, prolonged use outdoors.

On the other hand, in Comparative Example 1 in which a polysiloxane was only mixed with the acrylic resin, optical diffusion by phase separation in a resin layer was significant, the entire coating film was whitened, and hence, initial transmission was lowered. Also, in the weathering test, countless cracks were generated in the coating film. Furthermore, this was inferior to the present example in reliability over a long period of time.

In Comparative Example 2, where the fine particles of silicon oxidation were added to acrylic resin, the comparison result was similar to Examples 2 and 3 with respect to the initial transmission.

In the weathering test, the chalking that the fine particles of silicon oxidation were desorbed from a resin surface was observed, and long-term reliability was insufficient in relation to Comparative Example 1.

In Comparative Example 3, where the fine particles of titanium oxide were mixed into an acrylic resin, surface reflection of the resin surface resulting from the high refraction index characteristics of the titanium oxide increased, and the light transmittance decreased as a result. Also in the weathering test, chalking the same as that of Comparative Example 2 was observed, and hence, this was inferior to the present example.

As described above, according to the present invention, in the coating material that resin-coats a light-receiving plane side of a photovoltaic element and in a photovoltaic element in which at least a part of light-receiving plane side is resin-coated with a resin, it is possible to expect an increase in conversion efficiency by increasing incident light. Also, it is possible to obtain the weatherability, which provides the ability to tolerate the outdoor operating environment, because the above-described resin contains at least a first polymeric material and a second polymeric material made by bonding a polymer component (A) and a polymer component (B), wherein the polymer component (A) includes a functional group with comparatively high compatibility with the above-described first polymeric material, and the polymer component (B) includes a functional group with compatibility with the first polymeric material that is lower than the functional group of the polymer component (A), and wherein the polymer component (B) is a polymer blend forming an aggregate. In addition, it is possible to provide weatherability, which is excellent in long-term stabilization outdoors, by forming structure cross-linking the above-described first polymeric material and the above-described second polymeric material.

TABLE 1

| | Initial Transmittance | Weatherability | Temperature Cycle |
|---|---|---|---|
| Example 1 | AA | A | A |
| Example 2 | A | A | A |
| Example 3 | A | A | A |
| Comparative Example 1 | C | C | C |
| Comparative Example 2 | A | C | A |
| Comparative Example 3 | C | C | A |

What is claimed is:

1. A coating material, which resin-coats a light-receiving plane side of a photovoltaic element, comprising:
a resin, the resin being a polymer blend containing at least a first polymeric material, and a second polymeric material made by bonding a polymer component (A) and a polymer component (B),
wherein the polymer component (A) includes a functional group with comparatively high compatibility with the first polymeric material, and the polymer component (B) includes a functional group with compatibility with the first polymeric material that is lower than the compatibility of the functional group of the polymer component (A),
wherein the polymer component (B) forms an aggregate, and
wherein the first polymeric material and the polymer component (A) are polymers comprising a monomer containing a vinyl group.

2. The coating material according to claim 1, wherein the second polymeric material contains a hydroxyl group.

3. The coating material according to claim 2, wherein both the polymeric component (A) and the polymeric component (B) contain a hydroxyl group.

4. The coating material according to claim 1, wherein the polymeric component (B) is a polymer containing a polysiloxane group.

5. The coating material according to claim 1, wherein a component ratio of the polymer component (A) contained in the second polymeric material is 10 to 90 parts by weight.

6. The coating material according to claim 1, wherein a refraction index of the polymer component (B) differs from that of another polymer component which constitutes the polymer blend.

7. A coating material, which resin-coats a light-receiving plane side of a photovoltaic element, comprising:
a resin, the resin being a polymer blend containing at least a first polymeric material, and a second polymeric material made by bonding a polymer component (A) and a polymer component (B),
wherein the polymer component (A) includes a functional group with comparatively high compatibility with the first polymeric material, and the polymer component (B) includes a functional group with compatibility with the first polymeric material that is lower than the compatibility of the functional group of the polymer component (A), wherein the polymer component (B) forms an aggregate, and wherein monomers constituting the polymer component (B) contain a siloxane group and a vinyl group, and a numerical ratio of the siloxane group to the vinyl group is 1 to 1000.

8. A photovoltaic element in which at least a part of a light-receiving plane side of the photovoltaic element is resin-coated with a resin, the resin being a polymer blend containing at least a first polymeric material, and a second polymeric material made by bonding a polymer component (A) and a polymer component (B), wherein the polymer component (A) includes a functional group with comparatively high compatibility with the first polymeric material, and the polymer component (B) includes a functional group with compatibility with the first polymeric material which is lower than the compatibility of the functional group of the polymer component (A), and wherein the polymer component (B) forms an aggregate.

9. The photovoltaic element according to claim 8, wherein the first polymeric material and the polymer component (A) are polymers comprising a monomer containing a vinyl group.

10. The photovoltaic element according to claim 8, wherein the second polymeric material contains a hydroxyl group.

11. The photovoltaic element according to claim 10, wherein both the polymeric component (A) and the polymeric component (B) contain a hydroxyl group.

12. The photovoltaic element according to claim 8, wherein the polymeric component (B) is a polymer containing a polysiloxane group.

13. The photovoltaic element according to claim 8, wherein a component ratio of the polymer component (A) contained in the second polymeric material is 10 to 90 parts by weight.

14. The photovoltaic element according to claim 8, wherein monomers constituting the polymer component (B) contain a siloxane group and a vinyl group, and a numerical ratio of the siloxane group to the vinyl group is 1 to 1000.

15. The photovoltaic element according to claim 8, wherein a refraction index of the polymer component (B) differs from that of another polymer component which constitutes the polymer blend.

16. A photovoltaic element in which at least a part of a light-receiving plane side of the photovoltaic element is resin-coated with a resin, the resin comprising a cross-linked material in which a cross-linking structure is formed, obtained by cross-linking at least a first polymeric material and a second polymeric material formed by bonding a polymer component (A) and a polymer component (B), wherein the polymer component (A) includes a functional group having a comparatively high compatibility with the first polymeric material, and the polymer component (B) includes a functional group having a compatibility with the first polymeric material that is lower than the compatibility of the functional group of the polymer component (A), and wherein the polymer component (B) forms an aggregate.

17. The photovoltaic element according to claim 16, wherein a refraction index of the polymer component (B) differs from that of another polymer component that constitutes the cross-linked material.

* * * * *

UNITED STATES PATENT AND TRADEMARK OFFICE
CERTIFICATE OF CORRECTION

PATENT NO. : 6,706,960 B2
DATED : March 16, 2004
INVENTOR(S) : Hidenori Shiotsuka et al.

It is certified that error appears in the above-identified patent and that said Letters Patent is hereby corrected as shown below:

Column 1,
Line 37, "generate" should read -- should read -- are generated --; and
Line 39, "that" (second occurrence) should be deleted.

Column 4,
Line 24, "having a-Si" should read -- having an a-Si --.

Column 6,
Line 43, "rials" should read -- rial --.

Column 8,
Line 49, "section" should read -- connection with --; and
Line 50, "of the optical" should read -- the optical --.

Column 10,
Line 5, "siring" should read -- stirring --; and
Lines 11 and 49, "was" should read -- were --.

Signed and Sealed this

Third Day of August, 2004

JON W. DUDAS
*Acting Director of the United States Patent and Trademark Office*